(12) United States Patent
Gates et al.

(10) Patent No.: US 6,603,204 B2
(45) Date of Patent: Aug. 5, 2003

(54) LOW-K INTERCONNECT STRUCTURE COMPRISED OF A MULTILAYER OF SPIN-ON POROUS DIELECTRICS

(75) Inventors: Stephen McConnell Gates, Ossining, NY (US); Jeffrey Curtis Hedrick, Montvale, NJ (US); Satyanarayana V. Nitta, Poughquag, NY (US); Sampath Purushothaman, Yorktown Heights, NY (US); Cristy Sensenich Tyberg, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/795,431

(22) Filed: Feb. 28, 2001

(65) Prior Publication Data

US 2002/0117760 A1 Aug. 29, 2002

(51) Int. Cl.$^7$ .................. H01L 23/48; H01L 23/52; H01L 29/40
(52) U.S. Cl. .............. 257/760; 257/750; 257/759; 257/761; 257/762; 257/763; 257/764; 257/765
(58) Field of Search ................ 257/700–705, 257/750–768; 438/622–629

(56) References Cited

U.S. PATENT DOCUMENTS

| | | | |
|---|---|---|---|
| 5,371,047 A | * | 12/1994 | Greco et al. |
| 5,470,801 A | * | 11/1995 | Kapoor et al. |
| 5,661,344 A | * | 8/1997 | Havemann et al. |
| 6,071,809 A | | 6/2000 | Zhao .................. 438/634 |
| 6,093,966 A | * | 7/2000 | Venkatraman et al. |
| 6,153,528 A | * | 11/2000 | Lan |
| 6,316,833 B1 | * | 11/2001 | Oda |
| 6,329,062 B1 | * | 12/2001 | Gaynor |

OTHER PUBLICATIONS

Takao, Y., et al.,"A 0.11 μm CMOS Technology with Copper and Very–low–k Interconnects for High–Performance System–On–a Chip Cores", IEEE, (2000) pp. 23.1.1–23.1.4.

Hasegawa, T., et al.,"Copper Dual Damascene Interconnects with Low–K (Keff<3.0) Dielectrics Using FLARETM and an Organo–Silicate Hard Mask", IEEE, (1999) pp. 26.4.1–26.4.4.

* cited by examiner

Primary Examiner—Ha Tran Nguyen
(74) Attorney, Agent, or Firm—Scully, Scott, Murphy & Presser; Daniel P. Morris (57) ABSTRACT

A low-k dielectric metal conductor interconnect structure having no micro-trenches present therein and a method of forming such a structure are provided. Specifically, the above structure is achieved by providing an interconnect structure which includes at least a multilayer of dielectric materials which are applied sequentially in a single spin apply tool and then cured in a single step and a plurality of patterned metal conductors within the multilayer of spun-on dielectrics. The control over the conductor resistance is obtained using a buried etch stop layer having a second atomic composition located between the line and via dielectric layers of porous low-k dielectrics having a first atomic composition. The inventive interconnect structure also includes a hard mask which assists in forming the interconnect structure of the dual damascene-type. The first and second composition are selected to obtain etch selectivity of at least 10 to 1 or higher, and are selected from specific groups of porous low-k organic or inorganic materials with specific atomic compositions and other discoverable quantities.

29 Claims, 4 Drawing Sheets

LOW-K INTERCONNECT STRUCTURE COMPRISED OF A MULTILAYER OF SPIN-ON POROUS DIELECTRICS

FIELD OF THE INVENTION

The present invention relates to interconnect structures for high-speed microprocessors, application specific integrated circuits (ASICs), and other high-speed integrated circuits (ICs). The present invention provides low dielectric constant (i.e., low-k) interconnect structures having enhanced circuit speed, precise values of conductor resistance, and reduced fabrication cost. The structures of the present invention have a lower effective dielectric constant, improved control over metal line resistance, and reduced cost to fabricate compared to conventional structures of the prior art.

BACKGROUND OF THE INVENTION

Figure 1:
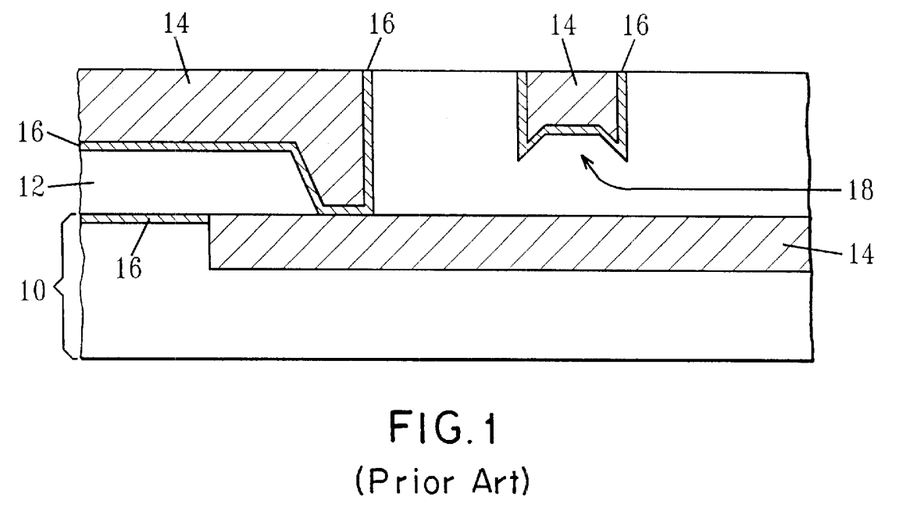
FIG. 1 is a pictorial representation of a prior art interconnect structure which includes a micro-trench that has a rough surface bottom formed therein.

Many low-k dielectrics having a dielectric constant of about 3.5 or less, plus Cu interconnect structures of the dual damascene-type are known; See, for example, R. D. Goldblatt, et al., "A High Performance 0.13 μm Copper BEOL Technology with Low-K Dielectric", Proceedings of the International Interconnect Technology Conference, IEEE Electron Devices Society, Jun. 5–7, 2000, pgs 261–263. During fabrication of prior art interconnect structures, the depth of the trenches that become the metal conductors (after metal fill and chemical-mechanical polishing (CMP)) is often poorly controlled, and the trenches develop a shape known as a micro-trench. A pictorial representation of prior interconnect structures containing micro-trenches is shown in FIG. 1. Specifically, FIG. 1 comprises substrate 10, low-k dielectric 12, and metal filled conductor regions 14 which include diffusion barrier liner 16. Note that the metal filled conductor region on the right-hand side of the figure includes micro-trench 18.

A timed reactive-ion etch (RIE) process is used to etch the trenches, with time controlling the depth of the trench. Both the etch rate and shape of the trench profile typically vary with trench width (feature size) across the wafers, leading to large variations in trench depth which, in turn, leads to large variations in the metal conductor resistance. These variations in etch rate and feature shape may change over time (day to day).

The rough shape of the trench bottom also causes a reliability problem because the diffusion barrier liner has weak (thin) locations when it is deposited onto a rough surface in the trench. Common solutions to the above problem of micro-trenching include the use of additional processing steps, which raise the overall production cost of fabricating the desired low-k dielectric plus Cu interconnect structure.

Also, the fabrication of the interconnect structures with copper, Cu, and low-k materials currently entails the use of spin-on coating tools and more expensive plasma-enhanced chemical vapor deposition (PECVD) tools. The use of mixed sets of tooling increases equipment purchase and maintenance cost and the raw time for fabrication.

In view of the problems with the prior art, there is a need to provide a new and improved method of manufacturing a low-k dielectric plus metal interconnect structure which avoids the formation of micro-trenches.

SUMMARY OF THE INVENTION

One object of the present invention is to provide a low-k dielectric plus metal interconnect structure of the dual damascene-type in which precise and uniform control over the metal conductor resistance can be obtained.

Another object of the present invention is to provide precise control over the shape of the metal conductors to improve reliability without added processing cost.

A further object of the present invention is to provide an interconnect structure in which the metal conductor has a substantially flat bottom, i.e., no micro-trenches are present.

A yet further object of the present invention is to provide a low-k dielectric plus metal interconnect structure (with precise and uniform control over the metal conductor resistance) that is based on a multilayer of spin coated dielectric layers; therefore avoiding the use of costly vacuum-based deposition tools.

Another object of the present invention is to use porous dielectrics having a k of about 3.5 or less.

These and other objects and advantages are achieved in the present invention by providing an interconnect structure which includes at least a multilayer of dielectric materials which are applied sequentially in a single spin apply tool and then cured in a single step and a plurality of patterned metal conductors within the multilayer of spun-on dielectrics. The control over the conductor resistance is obtained using a buried etch stop layer having a second atomic composition located between the line and via dielectric layers of porous low-k dielectrics having a first atomic composition. The inventive interconnect structure also includes a hard mask which assists in forming the interconnect structure of the dual damascene-type. The first and second composition are selected to obtain etch selectivity of at least 10 to 1 or higher, and are selected from specific groups of porous low-k organic or inorganic materials with specific atomic compositions and other discoverable quantities.

Specifically, the inventive dual damascene structure comprises:

a substrate having a patterned multilayer of dielectrics formed thereon, said patterned multilayer of dielectrics including first and second porous low-k dielectrics which are separated from each other by a buried etch stop layer, said first and second porous low-k dielectrics having a first composition;

a polish stop layer formed on said patterned multilayer of dielectrics over said second porous low-k dielectric; and a metal conductor formed within said patterned multilayer of dielectrics.

In one embodiment of the present invention, the first and second porous low-dielectrics are organic dielectrics, and the buried etch stop layer is an inorganic low-k dielectric material. In this embodiment of the present invention, the inorganic buried etch stop layer may be porous or non-porous, with preference given to porous inorganic buried etch stop layers.

In another embodiment of the present invention, the first and second porous low-k dielectrics are low-k inorganic dielectrics or inorganic/organic hybrid dielectrics such as methylsilsesquioxane (MSQ), and said buried etch stop layer is an organic low-k dielectric. In this embodiment of the present invention, the organic buried etch stop layer may be porous or non-porous, with preference given to non-porous materials.

The inventive structure offers the following advantages over prior art interconnect structures:

(i) Precise and uniform control of the metal conductor thickness and resistance.

(ii) Improved reliability because the trenches contain a diffusion barrier liner having a uniform thickness without weak points.

(iii) Highly controlled metal conductor resistance is obtained without added production cost, and with a reduction in the use of vacuum-based deposition tools.

Another aspect of the present invention relates to a method of fabricating the aforementioned low-k dielectric plus metal conductor interconnect structure which comprises the steps of:

(a) forming a multilayer of spun-on dielectrics on a surface of a substrate, said multilayer of spun-on dielectrics including first and second porous low-k dielectrics which are separated from each other by a buried etch stop layer, said first and second porous low-k dielectrics having a first composition, and said buried etch layer having a second composition which is different from said first composition;

(b) forming a hard mask on said multilayer of spun-on dielectrics, said hard mask including at least a polish stop layer and a patterning layer atop said polish stop layer;

(c) forming an opening in said hard mask so as to expose a surface of said multilayer of spun-on dielectrics;

(d) forming a trench level and a via level in said exposed surface of said multilayer of spun-on dielectrics using said hard mask as an etch mask;

(e) filling said trench level and via level with at least a conductive metal; and (f) planarizing said conductive metal stopping on said polish stop layer formed on said multilayer of spun-on dielectrics.

In one embodiment of the present invention, the multilayer of spun-on dielectrics is cured prior to conducting step (b). In another embodiment, wherein the hard mask also includes spun-on dielectrics, curing occurs after step (b).

DETAILED DESCRIPTION OF THE INVENTION

The present invention, which provides a low-k interconnect structure comprised of a multilayer of spin-on dielectrics and a method of fabricating the same, will now be described in more detail by referring to the drawings that accompany the present invention. It is noted that in the drawings, like and/or corresponding elements are referred to by like reference numerals.

Figure 2:
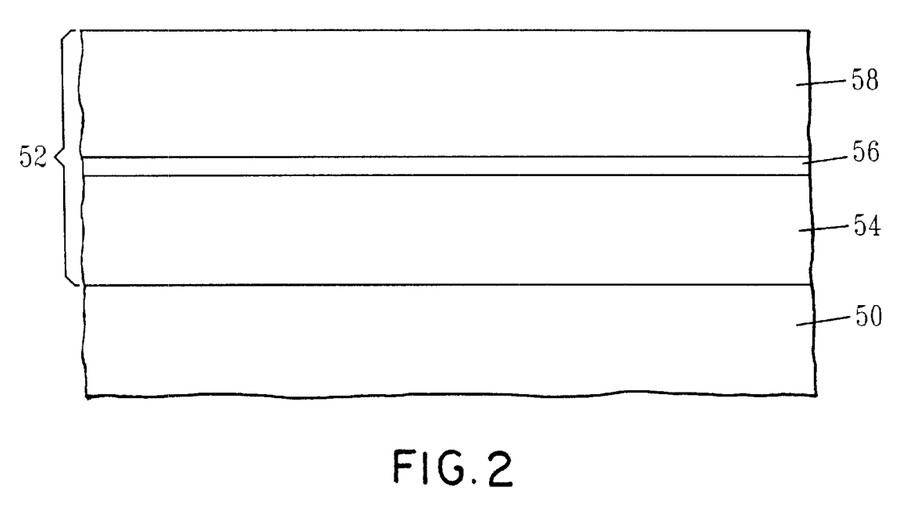
FIGS. 2–8 are cross-sectional views of the inventive structure through various processing steps of the present invention.

Reference is first made to FIG. 2 which illustrates an initial structure that is employed in the present invention in fabricating the inventive interconnect structure. Specifically, the structure illustrated in FIG. 2 comprises substrate 50 having multilayer of spun-on dielectrics 52 formed thereon. As shown, the inventive multilayer of spun-on dielectrics includes first low-k dielectric 54, buried etch stop layer 56 and second low-k dielectric 58. It is noted that the multilayer of spun-on dielectrics employed in the present invention has an effective dielectric constant of from about 1.1 to about 3.5, with an effective dielectric constant of from about 1.4 to about 3.0 being more highly preferred. In accordance with the present invention, the first and second low-k dielectrics are porous organic or inorganic (including inorganic/organic hybrids) dielectrics. It should be noted that the second low-k dielectric is the region wherein the metal line will be formed, whereas the first low-k dielectric is the region in which the metal via is formed.

As shown in FIG. 2, the buried etch stop layer is located in between the first and second porous low-k dielectrics. Moreover, the first and second porous low-k dielectrics employed in the present invention have a first composition, which is similar to each other, and the buried etch layer has a second composition which is different from said first composition. It is noted that the term "low-k" as used herein denotes dielectric materials having a dielectric constant of about 3.5 or less, with a dielectric constant of from about 1.4 to about 3.0 being more highly preferred. The exact content of each of the layers that make-up the multilayer of spun-on dielectrics will be described hereinbelow.

The substrate employed in the present invention may include any conventional material that is typically present in an interconnect structure. Thus, for example, substrate 50 may be a dielectric (interlevel or intralevel), a wiring level, an adhesion promoter, a semiconductor wafer or any combinations thereof. When a semiconductor wafer is employed as the substrate, the wafer may include various circuits and/or devices formed thereon.

Each layer of the multilayer of spun-on dielectrics is formed utilizing conventional spin-on coating processing steps that are well known to those skilled in the art, and following the spin-on process each layer is subjected to a hot plate bake process which is carried out using conditions that are sufficient to remove any residual solvent from the spun-on dielectric layer; and to render the film insoluble during the application of the subsequent layers. Typically, the hot plate bake is performed at a temperature of from about 90° to about 500° C. for a time period of from about 10 to about 600 seconds. More preferably, hot plate baking is performed at a temperature of from about 250° to about 400° C. for a time period of from about 60 to about 300 seconds.

In one embodiment of the present invention, the first and second low-k dielectrics are organic dielectrics, which comprise C, O and H. Examples of organic low-k dielectrics that can be employed in the present invention include, but are not limited to: aromatic thermosetting polymeric resins, for example, resins sold by Dow Chemical Company under the tradename SiLK®, Honeywell under the tradename Flare®, and similar resins sold by other supplies, and other like organic dielectrics. It is noted that the organic dielectric used in this embodiment of the present invention is porous. The pore size of the organic dielectrics employed in the present invention is from about 1 to about 50 nm at a volume percent porosity of from about 5 to about 35%.

When the first and second low-k dielectrics are composed of an organic dielectric, then the buried etch stop layer is formed of a spun-on inorganic dielectric layer or an inorganic/organic hybrid (i.e., a Si-containing dielectric). Typically, in the present invention, the inorganic dielectric buried etch stop layer comprises Si, O and H, (C may optionally be present) and has a dielectric constant of from about 1.1 to about 5.5, preferably from about 2.0 to about 3.2. Examples of inorganic dielectrics that can be employed as the buried etch stop layer include, but are not limited to: the silsesquioxane HOSP (Si-containing inorganic dielectric sold by Honeywell), tetraethylorthosilicate (TEOS), methylsilsesquioxane (MSQ), hydrido silsesquioxane (HSQ), MSQ-HSQ copolymers, organosilanes and any other Si-containing material. In this embodiment of the present invention, porous or non-porous inorganic dielectrics can be used as the buried etch stop layer, with preference given to porous inorganic dielectrics. While the pore size of the inorganic buried etch stop layer is not critical to the present invention, typically the inorganic buried etch stop layer has a pore size of from about 5 to about 500 Å at a volume percent porosity of from about 5 to about 80%. More preferably, the inorganic buried etch stop layer has a pore size of from about 10 to about 200 Å at a volume percent porosity of from about 10 to about 50%

$SiO_2$ (quartz)=2.65 g/cm$^3$

5% Porosity=2.52 g/cm$^3$ (2.65×0.95)

80% Porosity=0.53 g/cm$^3$ (2.65×0.20)

$HSiO_{3/2}$ (HSQ-hydrogen-silsesquioxane)-$p_0$=2.38 g/cm$^3$ (theoretical void-free density calculated from density of quartz $SiO_2$—J. of Applied Physics, Vol. 86, Number 6, Pp. 3104–3109)

5% Porosity 2.26 g/cm$^3$ (2.38×0.95)

80% Porosity 0.48 g/cm$^3$ (2.38×0.20)

Therefore the range of densities covered by the listed range of porosity is 0.48 to 2.52 g/cm$^3$.

In another embodiment of the present invention, the first and second porous low-k layers of the multilayer of spun-on dielectrics are porous low-k inorganic dielectrics and the buried etch stop layer is an organic dielectric material which may, or may not be porous. It is noted that the above description concerning the types of organic and inorganic dielectrics used in the first embodiment of the present invention also hold here for this embodiment. Thus, no further description is needed herein.

Notwithstanding which embodiment is employed in the present invention, the first porous low-k dielectric layer of the multilayer has a thickness of from about 500 to about 10,000 Å, with a thickness of from about 900 to about 3000 Å being more preferred. Insofar as the buried etch stop layer is concerned, that layer typically has a thickness of from about 25 to about 1500 Å, with a thickness of from about 100 to about 300 Å being more preferred. The second porous low-k dielectric layer of the multilayer, on the other hand, has a thickness of from about 500 to about 10,000 Å, with a thickness of from about 1000 to about 3000 Å being more preferred.

The multilayer of spun-on dielectrics may be cured now, or if the hard mask is made from spun-on dielectrics, the multilayer of spun-on dielectrics and hard mask may be cured in a single curing step. The later is preferred since it reduces the number of processing tools and steps in the overall procedure. The curing conditions mentioned hereinbelow also apply to the embodiment wherein curing occurs prior to formation of the hard mask.

Figure 3:
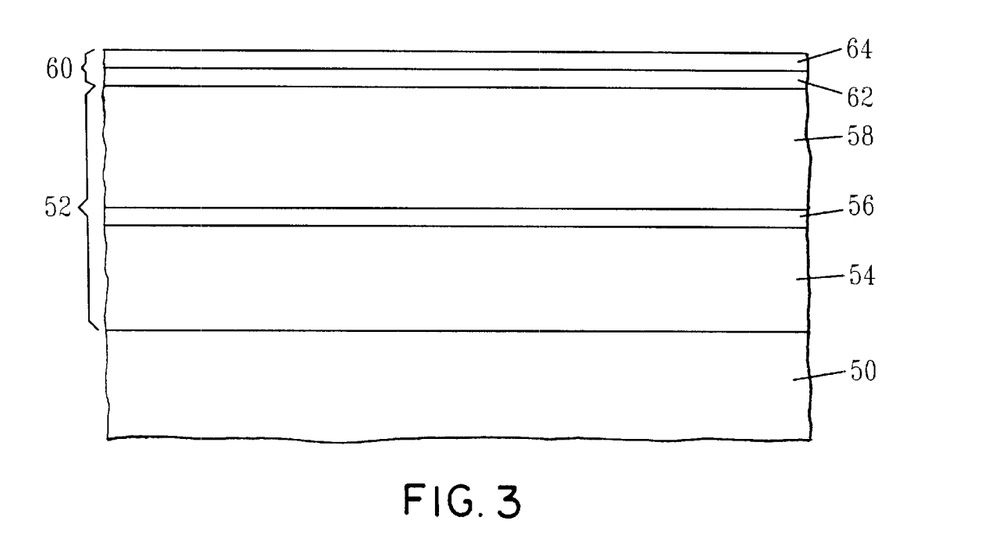

After forming the structure shown in FIG. 2, hard mask 60 is formed on the uppermost surface of the multilayer of spun-on dielectrics, i.e., on top of second low-k dielectric 58. In accordance with the present invention, hard mask 60 includes at least polish stop layer 62 and patterning layer 64. The hard mask, which is shown in FIG. 3, may be formed by conventional PECVD processes, or more preferably, each layer of hard mask 60 is formed by spin coating. Layers formed by spun-on coating are preferred since they reduce the number of deposition tools used in the overall process; therefore reducing the overall manufacturing cost. Moreover, although the drawings depict the presence of two layers in the hard mask, the hard mask may contain more than two layers.

The materials used in forming the hard mask may vary and are dependent upon their etch selectivity towards the layer that lies directly underneath. For example, the patterning layer employed in the present invention is a material that has high-etch selectivity (about 10:1 or greater) towards the underlying polish stop layer. The dielectric constant of the patterning layer may be high, as this layer is removed during step (f) of the present invention. The polish stop layer, on the other hand, is a material that has high-etch selectivity towards the underlying multilayer of spun-on dielectrics and it should have a dielectric constant that does not significantly increase the effective dielectric constant of the multilayer of spun-on dielectrics.

Accordingly, the patterning layer may include organic or inorganic dielectrics, while the polish stop layer may comprise inorganic or organic dielectrics. The exact nature of each layer will be dependent first upon the second low-k dielectric of the multilayer of spun-on dielectrics and then upon the polish stop layer. In one embodiment of the present invention, polish stop layer 62 and buried etch stop layer 56 are composed of the same materials.

The thickness of each layer of the hard mask may vary and is not critical to the present invention. Typically, however, the patterning layer has a thickness of from about 100 to about 3000 Å, and the polish stop layer has a thickness of from about 100 to about 1000 Å.

Following formation of the hard mask, the polish stop and patterning layers as well as the underlying multilayer of spun-on dielectrics may be subjected to a single curing step which is carried out using conventional conditions well known to those skilled in the art. The curing step may include a hot plate bake step or furnace heating. In the present invention, it is preferred to use a curing step that includes furnace baking. Although the conditions for curing may vary, typically, hot plate baking is carried out at temperature of from about 250° to about 500° C. for a time period of from about 30 to about 500 seconds, while the furnace baking step is carried out at a temperature of from about 200° to about 500° C. for a time period of from about 15 minutes to about 3.0 hours. It is again emphasized that if the hard mask is not composed of spun-on dielectrics, then curing may occur prior to hard mask deposition. Moreover, since a spun-on hard mask is preferred, the drawings and following description are specific for that embodiment. It is noted however that the drawings and following description are valid for hard masks that are not spun-on coated.

Figure 4:
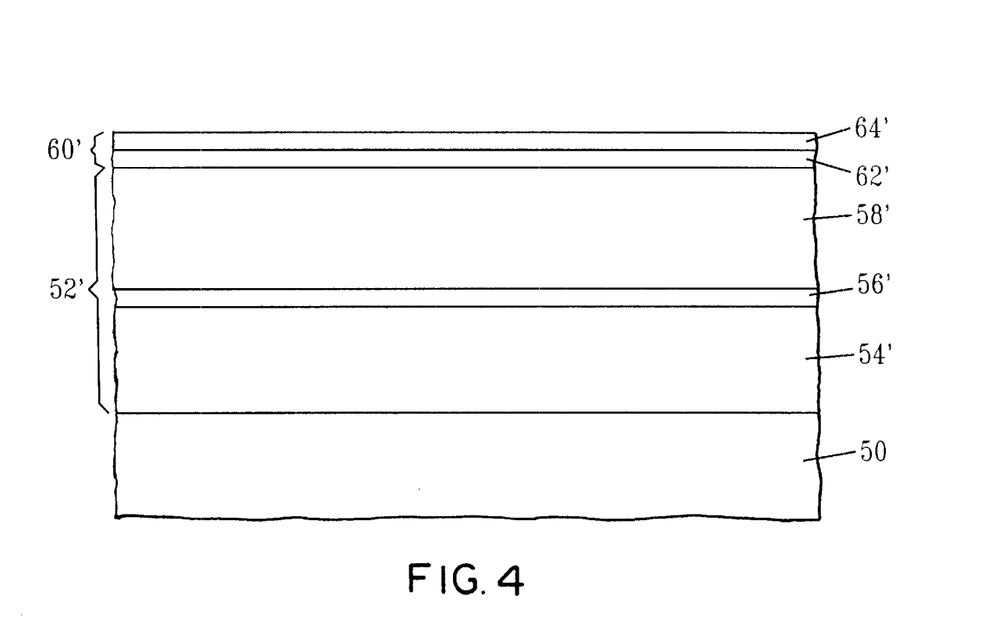
Figure 5:
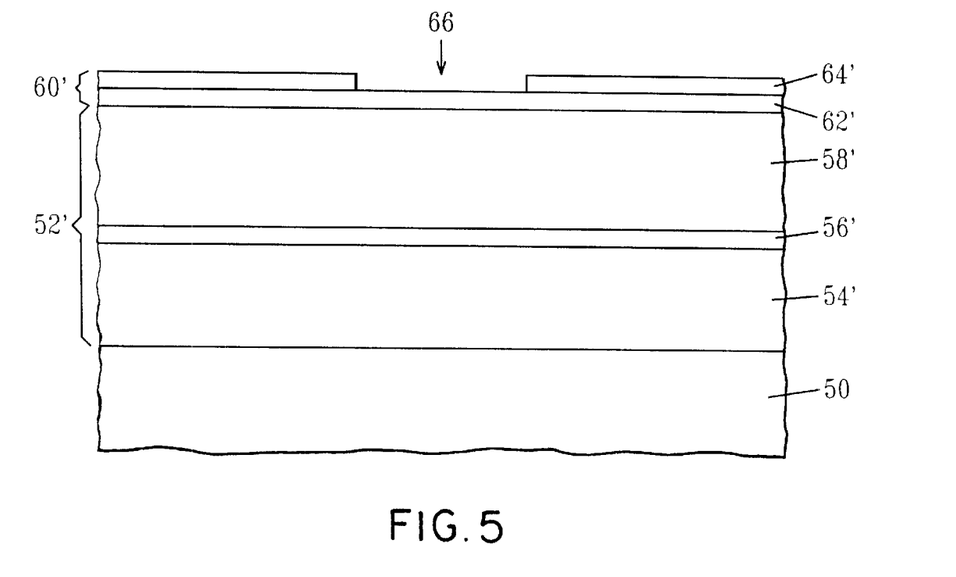

The cured layers are shown in FIG. 4 and are labeled as 52' (cured multilayer of spun-on dielectrics), 62' (cured polish stop layer) and 64' (cured patterning layer). Following curing of the dielectric multilayer and optionally the hard mask, the structure shown in FIG. 3 is then subjected to a first lithography and etching process which forms opening 66 in cured patterning layer 64'; See FIG. 5. Specifically, the structure shown in FIG. 5 is formed as follows: First, a photoresist (not shown in the drawings) used for patterning the patterning layer is formed on the cured patterning layer using conventional deposition processes well known to those skilled in the art. The photoresist is then exposed to a pattern of radiation and thereafter the pattern is developed in the photoresist using conventional resist developers.

After developing the resist pattern, opening 66 is formed in the hard mask so as to expose a portion of the underlying polish stop layer. Specifically, the opening is formed by a conventional dry etching process including, but not limited to: reactive-ion etching (RIE), plasma etching and ion beam etching. Of these various dry etching processes, it is preferred to use RIE that includes fluorine-based chemistries.

After this etching step, the patterned photoresist is stripped from the structure utilizing conventional stripping processes well known to those skilled in the art. The resultant structure obtained from the first lithography and etching step is shown in FIG. 5.

Figure 6:
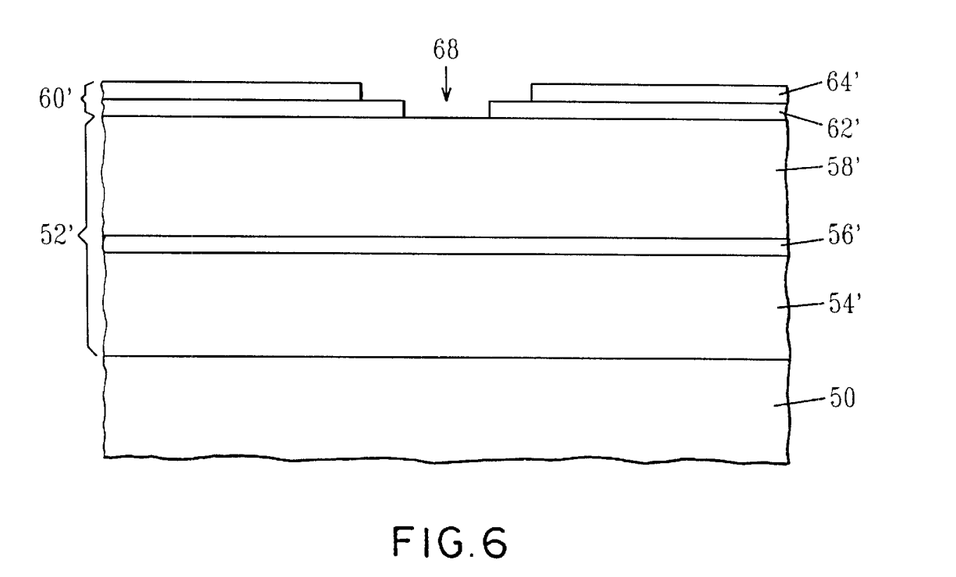

After stripping the photoresist from the structure, a new photoresist (not shown) is applied to the structure shown in FIG. 5. The new photoresist is then subjected to lithography and etching so as to provide second opening 68 in the structure which exposes a surface of cured multilayer of spun-on dielectrics 52'. The second etching step includes one of the aforementioned dry etching processes. Of these various dry etching processes, it is preferred to use RIE that includes fluorine-based chemistries. Following the second etch which exposes the cured multilayer of spun-on dielectrics, the second photoresist is stripped from the structure utilizing a conventional stripping process providing a structure such as shown in FIG. 6.

Figure 7:
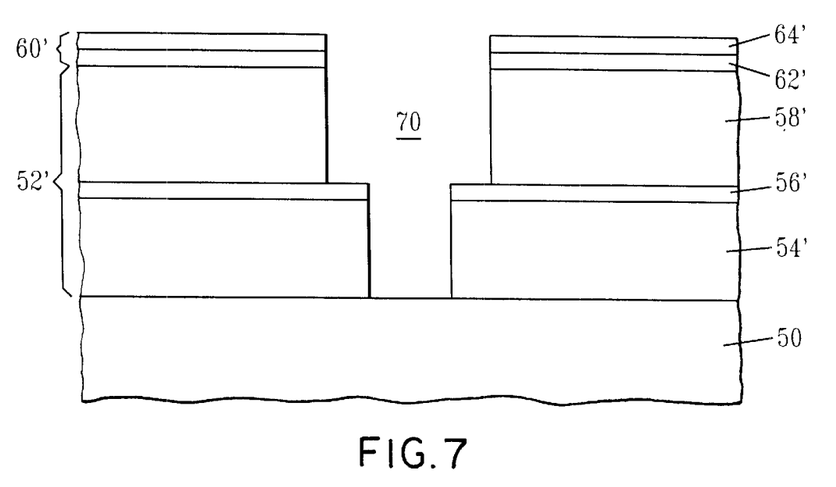

FIG. 7 shows the structure after the pattern formed in the hard mask is transferred to the multilayer of spun-on dielectrics. Specifically, the pattern transfer, which forms trench 70 in the multilayer of spun-on dielectrics, is carried out using a dry etching process that includes oxygen or reducing chemistry. In accordance with the present invention, trench 70 may be a via or line or both.

Figure 8:
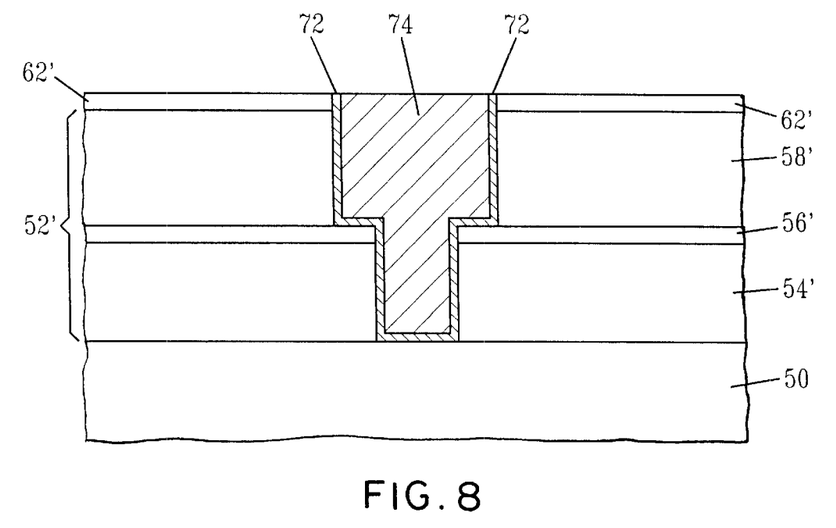

Following the pattern transfer to the multilayer of spun-on dielectrics, the trench is then filled with a conductive metal 74 and planarized so as to provide the structure shown in FIG. 8. An optional, but preferable liner material 72 may be formed in the trench prior to filling with the conductive metal. The term "conductive metal" is used herein to denote a metal selected from the group consisting of aluminum (Al), copper (Cu), tungsten (W), silver (Ag) and other like metals which are typically used in interconnect structures. Alloys of these conductive metals such as Al—Cu are also contemplated herein. A preferred metal used in the present invention is copper. The metal is formed in the trench utilizing a conventional deposition process such as chemical vapor deposition (CVD), plasma-assisted CVD, plating, sputtering, chemical solution deposition and other like deposition processes.

The optional liner material employed in the present invention includes any material which would prevent the diffusion of the conductive metal into the dielectric layers. Some examples of such liners include, but are not limited to: TiN, TaN, Ti, Ta, W, WN, Cr, Nb and other like materials including combinations thereof. The liner material may be formed in the trench utilizing conventional deposition processes well known to those skilled in the art, including: CVD, plasma-assisted CVD, sputtering, plating and chemical solution deposition.

After filling the trench with a conductive metal, the structure is subjected to a conventional planarization process such as chemical-mechanical polishing (CMP) which removes any conductive metal above the polish stop layer. Note that the planarization step also removes the patterning layer of the hard mask, but not the polish stop layer from the structure. Instead, the polish stop layer remains on the surface of the structure. Because of this reason, it is essential to choose a polish stop layer that has a dielectric constant that is relatively-low so as to not increase the effective dielectric constant of the interconnect structure.

Following the processing steps of the present invention additional via and wiring levels may be formed over the structure shown in FIG. 8 by repeating the processing steps of the present invention. Thus, the inventive method can be used to prepare interconnect structures that include one or more wiring and via levels present therein.

The following example is given to illustrate the method of the present invention as well as to show some advantages thereof.

EXAMPLE

In this example, a SiLK®/HOSP/SiLK®/HOSP dielectric stack was prepared and used in forming an interconnect structure. Specifically, a bare 8 inch Si wafer was used as the substrate in this example. The wafer was treated with an adhesion promoter by applying a 2.5 wt. % solution of an organosilane adhesion promoter in propylene glycol methyl ether acetate (PGMEA) to the wafer followed by spinning at about 3000 rpm for about 30 seconds. The wafer was then placed on a hot plate and was baked at about 100° C. for about 90 seconds. This bake promoted reaction of the adhesion promoter to the surface of the wafer. After cooling to room temperature, the wafer with adhesion promoter was rinsed with PGMEA to remove excess adhesion promoter. The wafer was flushed with about 30 ml of PGMEA and then spun at about 3000 rpm for about 30 seconds.

Following this rinse, the wafer was baked on a 100° C. hot plate for about 1 minute to dry the solvent. After cooling to room temperature, the first layer of low-k dielectric (SiLK®) was applied. The SiLK® solution was placed on the wafer and the wafer was spun at about 3000 rpm for about 30 seconds. After spinning, the wafer was placed on a 100° C. hot plate for 1 minute to partially dry the solvent. It was then transferred to a 400° C. hot plate and baked for about 2 minutes. This time and temperature was sufficient to render the resultant SiLK® film insoluble.

After cooling, the wafer was returned to the spinner. A solution of HOSP, diluted to achieve a film thickness of about 50 nm at a spin speed of about 3000 rpm, was applied the wafer and spun at 3000 rpm for about 30 seconds. After spinning, the wafer was placed on a hot plate at 100° C. for about 1 minute to partially dry the solvent. It was then moved to a 400° C. hot plate for about 2 minutes to partially crosslink the film. This time and temperature was sufficient to render the film insoluble.

The wafer was then allowed to cool and was returned to the spinner. The second layer of SiLK® was applied to the first layer. SiLK® was applied to the wafer and the wafer was spun at about 3000 rpm for about 30 seconds. The wafer was placed on a 100° C. hot plate for about 1 minute, followed by a 400° C. hot plate for about 2 minutes.

After cooling to room temperature, the wafer was returned to the spinner. A two layer hard mask was then applied as follows. A layer of HOSP was applied. The HOSP solution, diluted to achieve a film thickness of about 500 Å at a spin speed of about 3000 rpm, was applied to the wafer and the wafer was spun at about 3000 rpm for about 30 seconds. The wafer was then hot plate baked at about 100° C. for about 1 minute and about 400° C. for about 2 minutes.

The cured wafer containing the layers described above was placed in a PECVD reactor and a 500 Å layer of silicon nitride was deposited at about 350° C., and then a 1200 Å layer of $SiO_2$ was deposited at about 350° C.

Lithography and etching processes are then performed as described in the text of the present application. The dual damascene structure is then completed using standard process methods known in the industry (the etched trench and via opening are filled with a liner and then with Cu, and the Cu is planarized by CMP).

During the final CMP process, the silicon nitride layer remains in the structure and the $SiO_2$ layer deposited above is removed.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. An interconnect structure comprising:
    a substrate having a patterned multilayer of dielectrics located thereon, said patterned multilayer of dielectrics including first and second porous low-k dielectrics which are directly separated from each other by a buried etch stop layer, said first and second porous low-k dielectrics having a first composition, and said buried etch stop layer is selected from the group consisting of an inorganic dielectric, an inorganic/organic hybrid dielectric, and an organic dielectric with the proviso that when the buried etch stop layer is an inorganic material then the first and second porous low-k dielectrics are organic dielectrics, and when the buried etch stop layer is an organic material then the first and second porous low-k dielectrics are inorganic dielectrics, said first composition and said buried etch stop layer are selected to provide an etch selectivity of at least 10:1 or greater;
    a polish stop layer atop said patterned multilayer of dielectrics over said second porous low-k dielectric; and
    a metal conductor comprising at least one line and at least one via located within said patterned multilayer of dielectrics, wherein said at least one line is located in said second porous low-k dielectric and said at least one via is located in said first porous low-k dielectric.

2. The interconnect structure of claim 1 wherein said first and second porous low-k-dielectrics are organic dielectrics, and the buried etch stop layer is an inorganic low-k dielectric material or an inorganic/organic hybrid material.

3. The interconnect structure of claim 2 wherein said first and second porous low-k organic dielectrics have a pore size of from about 1 to about 50 nm at a volume percent porosity of from about 5 to about 35%.

4. The interconnect structure of claim 2 wherein said inorganic low-k dielectric buried etch stop layer is porous.

5. The interconnect structure of claim 4 wherein said inorganic porous low-k dielectric etch stop layer has a pore size of from about 5 to about 500 Å at a volume percent porosity of from about 5 to about 80%.

6. The interconnect structure of claim 4 wherein said porous inorganic low-k dielectric buried etch stop layer has a density of from about 2.52 gm/cm$^3$ to about 0.53 gm/cm$^3$.

7. The interconnect structure of claim 2 wherein said first and second porous low-k organic dielectrics comprises C, O and H.

8. The interconnect structure of claim 7 wherein said first and second porous low-k organic dielectrics are aromatic thermosetting polymeric resins.

9. The interconnect structure of claim 2 wherein said buried etch stop layer comprises Si, O and H, and optionally C.

10. The interconnect structure of claim 8 wherein said buried etch stop layer comprises HOSP, MSQ, TEOS, HSQ, MSQ-HSQ copolymers, organosilanes, or any other Si-containing material.

11. The interconnect structure of claim 1 wherein said first and second porous low-k dielectrics are low-k inorganic dielectrics, and said buried etch stop layer is an organic low-k dielectric.

12. The interconnect structure of claim 11 wherein said first and second porous low-k inorganic dielectrics have a pore size of from about 5 to about 500 Å at a volume percent porosity of from about 5 to about 80%.

13. The interconnect structure of claim 11 wherein said organic low-k dielectric buried etch stop layer is porous.

14. The interconnect structure of claim 13 wherein said organic porous low-k dielectric etch stop layer has a pore size of from about 1 to about 50 nm at a volume percent porosity of from about 5 to about 35%.

15. The interconnect structure of claim 11 wherein said organic dielectric etch stop comprises C, O and H.

16. The interconnect structure of claim 15 wherein said organic dielectric etch stop layer is an aromatic thermosetting polymeric resin.

17. The interconnect structure of claim 11 wherein said first and second porous low-k inorganic dielectric layers comprise Si, O and H, and optionally C.

18. The interconnect structure of claim 17 wherein said first and second porous low-k inorganic dielectric layers comprise HOSP, MSQ, TEOS, HSQ, MSQ-HSQ copolymers, organosilanes or any other Si-containing material.

19. The interconnect structure of claim 1 wherein said first and second porous low-k dielectrics have a dielectric constant of from about 1.1 to about 3.5.

20. The interconnect structure of claim 19 wherein said dielectric constant is from about 1.4 to about 3.0.

21. The interconnect structure of claim 1 wherein said multilayer of dielectrics have an effective dielectric constant of about 3.5 or less.

22. The interconnect structure of claim 1 wherein said substrate is a dielectric, a wiring level, an adhesion promoter layer, a semiconductor wafer or combinations thereof.

23. The interconnect structure of claim 1 wherein said substrate is a semiconductor wafer having an adhesion promoter layer formed thereon.

24. The interconnect structure of claim 1 wherein said polish stop layer is composed of the same material as the buried etch stop layer.

25. The interconnect structure of claim 1 wherein said polish stop layer is a spun-on low-k inorganic or organic dielectric.

26. The interconnect structure of claim 1 wherein said metal conductor is composed of Al, Cu, W, Ag or alloys thereof.

27. The interconnect structure of claim 1 wherein said metal conductor is composed of Cu.

28. The interconnect structure of claim 1 further comprising a liner material formed within said patterned multilayer of dielectrics prior to deposition of said metal conductor.

29. The interconnect structure of claim 28 wherein said liner material is composed of TiN, TaN, Ti, Ta, W, WN, Cr, Nb or combinations thereof.

* * * * *

UNITED STATES PATENT AND TRADEMARK OFFICE
CERTIFICATE OF CORRECTION

PATENT NO.     : 6,603,204 B2
DATED          : August 5, 2003
INVENTOR(S)    : Stephen M. Gates et al.

It is certified that error appears in the above-identified patent and that said Letters Patent is hereby corrected as shown below:

<u>Column 10,</u>
Line 1, "claim 8" should read -- claim 9 --

Signed and Sealed this

Thirteenth Day of April, 2004

JON W. DUDAS
*Acting Director of the United States Patent and Trademark Office*